United States Patent [19]
Tran

[11] Patent Number: 5,270,976
[45] Date of Patent: Dec. 14, 1993

[54] LASER LINK DECODER FOR DRAM REDUNDANCY SCHEME

[75] Inventor: Tran V. Tran, Carrollton, Tex.

[73] Assignee: Texas Instruments Incorporated, Dallas, Tex.

[21] Appl. No.: 946,046

[22] Filed: Sep. 15, 1992

Related U.S. Application Data

[63] Continuation of Ser. No. 839,012, Feb. 17, 1992, abandoned, which is a continuation of Ser. No. 540,254, Jun. 19, 1990, abandoned.

[51] Int. Cl.$^5$ ............................................. G11C 29/00
[52] U.S. Cl. ..................................... 365/200; 365/96;
    365/225.7; 365/230.03; 365/230.06; 307/202.1;
    307/219; 307/441; 307/449; 371/10.3
[58] Field of Search ..................... 365/96, 200, 225.7,
    365/230.06, 230.03; 307/449, 219, 441, 202.1;
    371/10.3

[56] References Cited

U.S. PATENT DOCUMENTS

| | | | |
|---|---|---|---|
| 4,546,455 | 10/1985 | Iwahashi et al. | 365/225.7 |
| 4,638,466 | 1/1987 | Fukumoto | 365/225.7 |
| 4,724,422 | 2/1988 | Golab | 365/200 |
| 4,922,134 | 5/1990 | Hoffmann et al. | 365/925.7 |
| 4,985,866 | 1/1991 | Nakaizumi | 365/200 |
| 5,058,059 | 10/1991 | Matsuo et al. | 365/200 |
| 5,153,880 | 10/1992 | Owen et al. | 365/200 |

Primary Examiner—Joseph E. Clawson, Jr.
Attorney, Agent, or Firm—Stanton C. Braden; Richard L. Donaldson; William E. Hiller

[57] ABSTRACT

A decoder for a memory redundancy scheme is disclosed which allows replacement of a number of memory cell locations in connection with the state of a plurality of fuses.

11 Claims, 6 Drawing Sheets

LASER LINK DECODER FOR DRAM REDUNDANCY SCHEME

This application is a continuation of application Ser. No. 07/839,012, filed Feb. 17, 1992 now abandoned, which is a continuation of application Ser. No. 07/540,254, filed Jun. 19, 1990, abandoned.

FIELD OF THE INVENTION

This invention is in the field of integrated circuits and is specifically directed to memories.

BACKGROUND OF THE INVENTION

FIG. 1 illustrates a schematic drawing of a prior art dynamic random access memory (DRAM) redundancy scheme which includes each memory block, labeled MB with an identifying subscript, and a plurality of redundant blocks of memory, RB, each associated with a memory block and carrying the same subscript. Each redundant block of memory RB and its associated memory block MB share bit lines (each bit line represent as BL). A plurality of sense amplifiers is also shown in FIG. 1 with each sense amplifier S/A (hereinafter referred to as sense amp) lying adjacent to and carrying the sam subscript as its associated memory block. Redundant blocks of memory serve to provide alternate memory service. For instance, if word line $WL_1$ or a memory cell along word line $WL_1$ in memory block $MB_1$ is defective, word line $WL_{1R}$ in redundant memory block $RB_1$ is used along with its row (illustrated as verticle columns) of memory cells (each asterisk representing a memory cell).

OBJECTS OF THE INVENTION

It is an object of the invention to provide a new and improved decoder.

It is another object of the invention to provide a new and improved decoder for a memory redundancy scheme.

These and other objects of the invention together with the features and advantages thereof will become apparent from the following detailed specification when read together with the accompanying drawings in which applicable reference numerals have bee carried forward.

SUMMARY OF THE INVENTION

The foregoing objects of the invention are accomplished by decoders comprised of a series of transistors which receive a subcircuit input. Each subcircuit contains a fuse which is set corresponding to a particular address state ( i.e. ether 1 or 0). Consequently, the decoders are responsive to a particular address. The decoders are connected to a common line to its transistors which achieves a necessary state when the current address which is input bit by bit to a corresponding subcircuit, matches an address for which main memory replacement has been determined. The common line in its necessary state can activate drivers for activating the redundant replacement memory. Each decoder also contains a plurality of fuses associated with a portion of its transistors which can be set in such a manner so as to result in replacement of a segment of all memory locations preceding the current address.

DETAILED DESCRIPTION OF THE INVENTION

Figure 1:
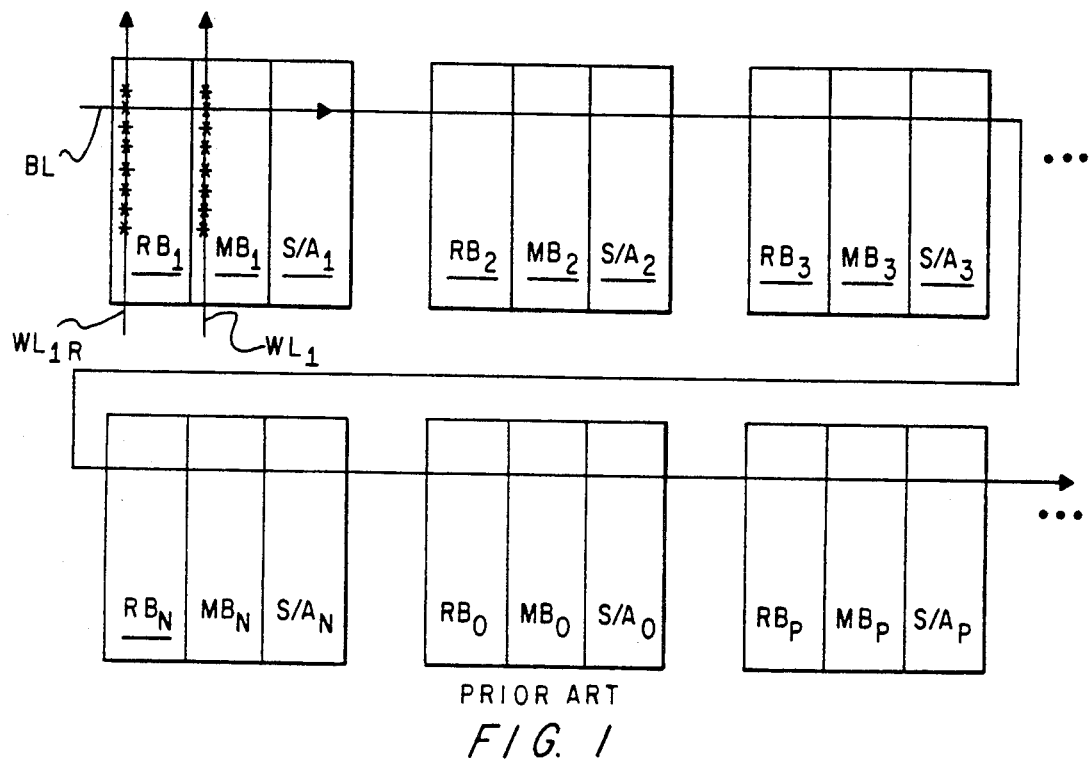
FIG. 1 illustrates a schematic drawing of a prior art dynamic random access memory (DRAM) redundancy scheme.
Figure 2:
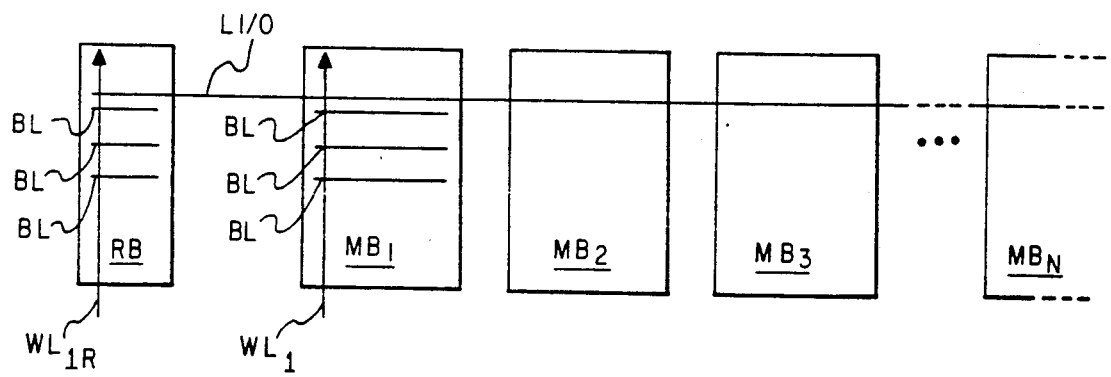
FIG. 2 illustrates a schematic drawing of a first preferred embodiment of the invention's DRAM redundancy scheme.

FIG. 2 illustrates a schematic drawing of a first preferred embodiment of the invention's DRAM redundancy scheme. As shown, only one redundant block of memory RB is required for a plurality of memory blocks. Redundant block of memory RB has its own independent bit lines (each labeled BL) unlike that of the prior art in which bit lines of the redundant block and its associated memory block are shared. Here, local input/output (L I/O) data line is shared by redundant block of memory RB and a plurality of memory blocks MB. If there is a defect associated with word line $WL_1$ in memory block $MB_1$, then word line $WL_{1R}$ from the redundant block is used along with its associated memory cells in redundant block RB. Alternatively, any word line and memory cells from any of the other blocks can be replaced through the use of redundant block RB. The number of word lines and associated circuitry (i.e. memory cells) which can be corrected depends on the number of word lines and associated circuitry in the redundant block. Thus, if the redundant block has 5 rows of memory cells, 5 word lines and their associated cells can be corrected from any of the memory blocks.

Figure 3:
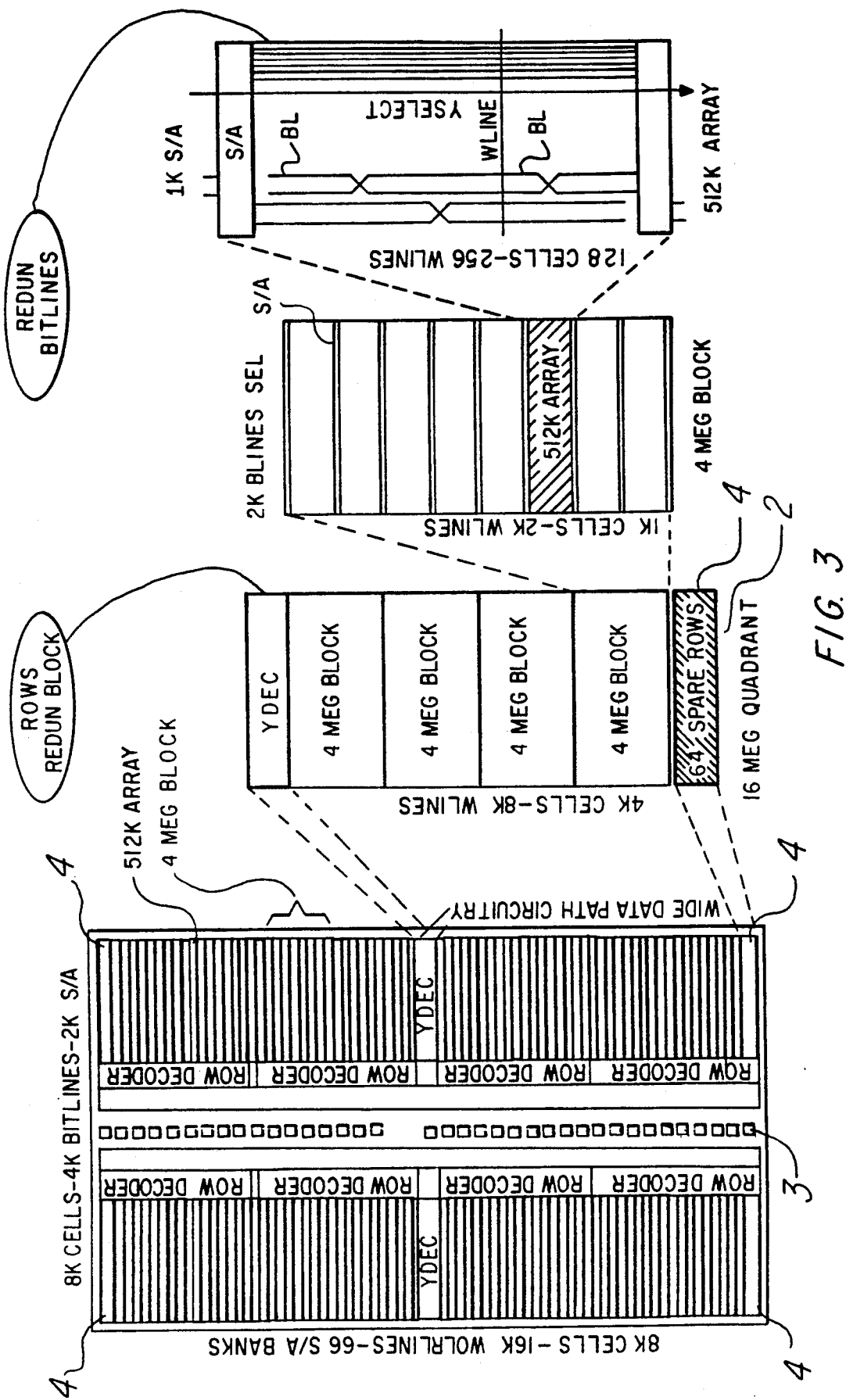
FIG. 3 illustrates a diagram of a first preferred layout of the invention implementing a 64 megabit DRAM with exploded views of selected components.

FIG. 3 illustrates a diagram of a first preferred layout of the invention implementing a 64 megabit DRAM with exploded views of selected components. There are 8000 (8k) memory cells, 16,000 (16k) word lines, and 2000 (2k) sense amps (S/A) in the 64 meg DRAM of FIG. 3. As illustrated, an exploded view of a section along the dashed line details one 16 megabit quadrant 2. There are 4000 (4K) memory cells and 8000 (8K) word lines in each 16 meg quadrant. Note that a block of redundant rows 4 exists for each 16 megabit quadrant of memory. In this example, there are 64 redundant rows of memory in each block of redundant rows 4. Each 16 megabit quadrant 2 is partitioned into four 4 megabit (4 meg) memory blocks with each block including four 512 kilobit (512k) memory arrays. As shown, another exploded view of memory along dashed lines details a 4 meg block of memory. For ease of illustration, only one 512k array is labeled along with a section of sense amplifiers S/A. A section of sense amplifiers abuts each array. There are 1000 (1k) memory cells and 2000 (2k) word lines in each 4 meg block. The number of bit lines in a 4 meg block is on the order of 2000. The labeled 512k array and its associated sense amplifiers S/A are exploded into a more detailed view in which bit lines BLs are of the twisted variety. There are 128 memory cells and 256 word lines in each 512k array. Word line WLINE and bit line YSELECT indicate a word line and a bit line respectively, selected by a respective row decoder and column decoder YDEC. The intersection of a bit line with a word line as shown indicates the location of a chosen memory cell. The small section of closely spaced vertical lines labeled REDUN BIT-LINES indicates the bit lines for the redundant memory cells. Bond pads 3 for the address, control, and input-/output (I/O) are represented by the small squares down the middle of chip 2. The location of wide data path circuitry is indicated as shown.

Figure 4:
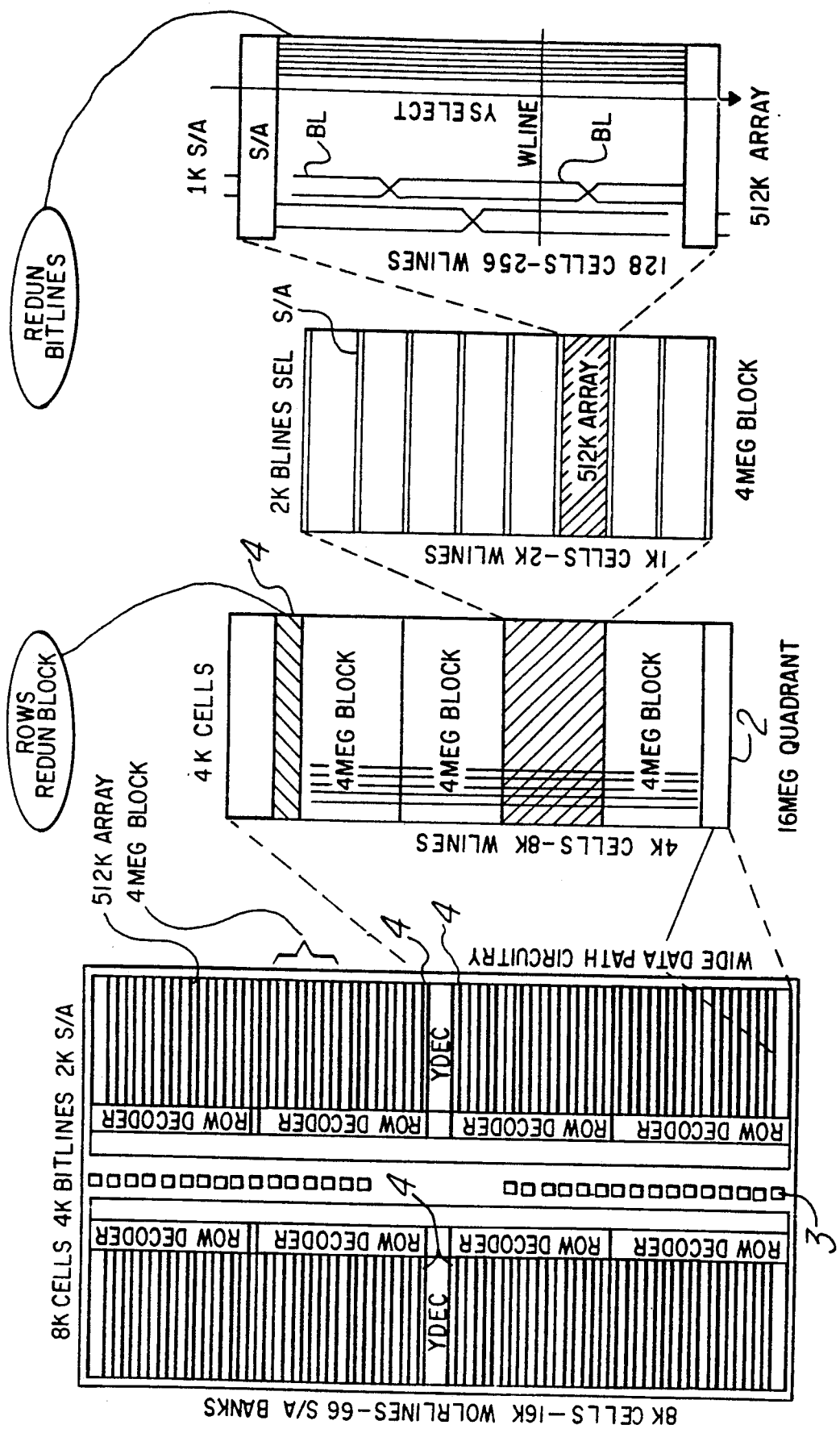
FIG. 4 illustrates a diagram of a second preferred layout alternative to that shown in FIG. 3 for the invention implementing a 64 megabit DRAM.

A second preferred layout alternative to that shown in FIG. 3 for the invention implementing a 64 megabit DRAM is illustrated in the diagram in FIG. 4. The position of the redundant blocks differs from that shown in FIG. 3. Note that the redundant blocks are near the column decoders (YDEC). This positioning of the redundant blocks near the column decoders can increase the operating speed of the memory.

Figure 5:
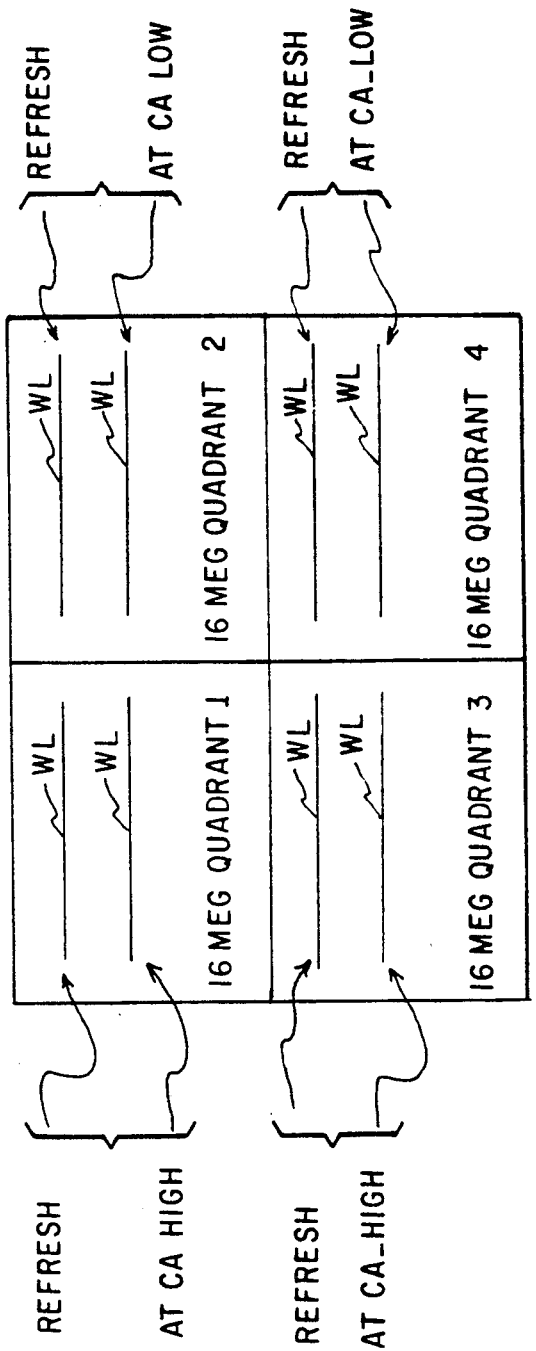
FIG. 5 illustrates a diagram of one possible scheme showing the use of the signal bits in selecting word lines for refresh.

Memory cells of a DRAM must be refreshed to prevent loss of data. Generally, this is accomplished by the word line of a cell being energized so as to allow the cell's bit line to reinsert data to the cell via a sense amplifier. Refresh of a memory cell is required after reading data out of the cell. Refresh is also routinely required to prevent loss of memory storage through capacitor leakage. The refresh operation of the preferred embodiment of the 64 meg DRAM is such that 8k of memory cells are refreshed at a time. This translates into four word lines (2k memory cells on each word line) on the 64 meg chip being refreshed at the same time. Column address program (CA PROG) provides a signal bit either CA or $CA_{13}$ which allows the selection of four word lines for refresh including any word lines from which the data of an associated cell is desired. FIG. 5 illustrates a diagram of one possible scheme showing the use of the signal bits in selecting word lines for refresh. Memory cells of two word lines from a pair of diagonally positioned 16 meg qaudrants are refreshed. For instance, when signal bit CA is logic high, signal bit CA_, its complement, is logic low. Consequently, in the scheme shown in FIG. 5, two word lines in 16 meg quadrant 1 are refreshed along with two word lines in 16 meg quadrant 4. Alternatively, when signal bit CA_ is logic high, its complement, signal bit CA is of logic low, thereby resulting in two word lines in both 16 meg quadrants 2 and 3 being refreshed. In either of the cases given above concerning the logic states of signal bits CA and CA_, one of the word lines for a cell selected for refresh will be a word line for a cell selected for reading information therefrom. Refresh of the cells of the selected word line occurs after the selected cell information has been read. Should the row address of a selected cell correspond to an address identified by circuitry (not shown) as having a defective word line, then replacement of the cell with a cell of a redundant word line takes place in accordance with the following description.

Figure 6:
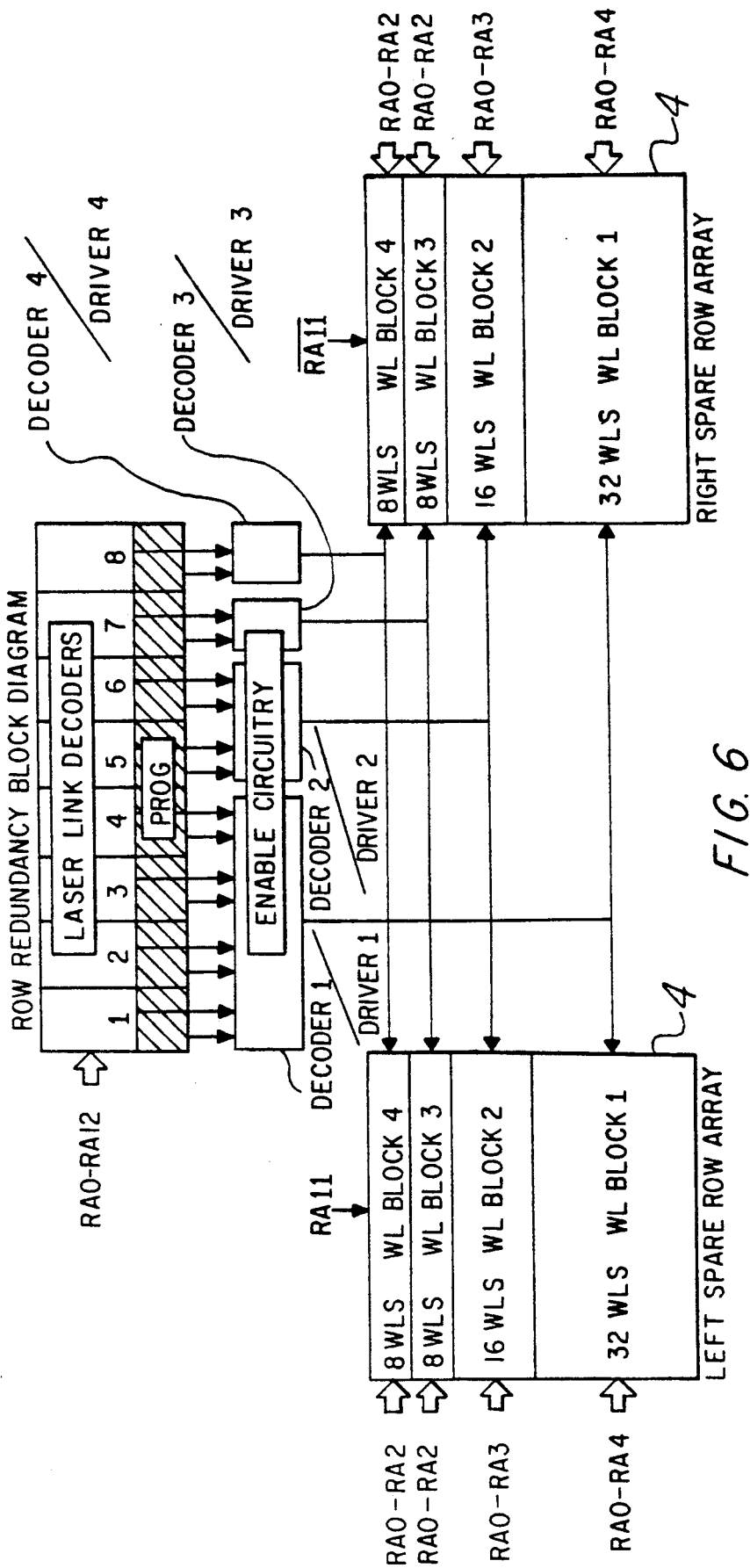
FIG. 6 illustrates a block diagram of the row redundancy scheme.

FIG. 6 illustrates a block diagram of the row redundancy scheme. As shown, redundant rows 4, referenced respectively as left and right spare row arrays are each divided into 2 groups of 8 word lines (WLs), 1 group of 16 WLs, and 1 group of 32 WLs. Enable circuitry comprising decoders labeled 1, 2, 3, and 4, enables redundant word line blocks labeled 1, 2, 3, and 4 to provide replacement for word line rows of memory within the 4 meg blocks based on signals received from a plurality of laser link decoders. Alternatively, instead of decoders, enable circuitry can comprise drivers, whereby redundant row selection in spare row arrays is determined by the plurality of laser link decoders. Although only 8 laser link decoders are illustrated in FIG. 6, fewer or more may be used. The redundant memory along word lines are addressable by a portion of the address from the non redundant or rather main memory array. Thus, although the current address from main memory is for instance, 12 bits long, the redundant memory can for instance be addressed by 2 to 5 bits which can reflect the least significant 2 to 5 bits in the 12 bit long current address as shown in FIG. 6. Word line block 1 comprises 32 word lines addressable by row addresses RA0 to RA4, the five least significant bits of the current row address, the four lease significant bits of the current row address. Word line block 2 comprises 16 word lines addressable by row addresses RA0 to RA3, the four least significant bits of the current row address. Word line block 3 comprises 8 word lines addressable by row addresses RA0 to RA2 the three lease significant bits of the current row address. Word line block 4 comprises 8 word lines addressable by row addresses RA0 to RA2, the three lease significant bits of the current row address. As a consequence of the above discussed addressability, should for instance, rows 3-10 of a first 4 meg block be defective, either of laser link decoders 1 to 4 could provide replacement of these defective rows with the available 32 word line rows of redundant memory in redundant block 1 addressed by RA0-RA4. If, for instance, in addition to the defective rows 3-10 of the first block, rows 3-10 of a second 4 meg block are defective, decoders 5 or 6 can provide replacement of the defective rows in the second block with redundant rows from the available 16 word line rows of redundant memory in redundant block 2 addressed by RA0-RA3. Further, if rows 3-10 of a third 4 meg block are additionally defective, decoder 7 can provide replacement of the defective rows in the third block with redundant rows from the available 8 word line rows of redundant memory in redundant block 3 addressed by RA0-RA2. If in addition to the defective rows 3-10 in the first, second and third blocks, rows 3-10 in a fourth 4 meg block of memory are defective, decoder 8 can provide replacement of the defective rows in the fourth block of memory with redundant rows from the available 8 word line rows of redundant memory in redundant block 4 addressed by RA0-RA2. As shown, redundant word line blocks are in either a right or left spare row array. A right or left spare row selection is determined by row address RA11 and its complement RA11_ such that a high signal on an address bit indicates selection of a corresponding spare row array. An optimal replacement scheme for the memory can be determined by a computer program 9 (represented in FIG. 6 as PROG) using linear programming or other techniques. Alternatively, a computer program is not necessary to implement this aspect of the invention. Therefore, a human operator can determine the order of replacement.

Figure 7:
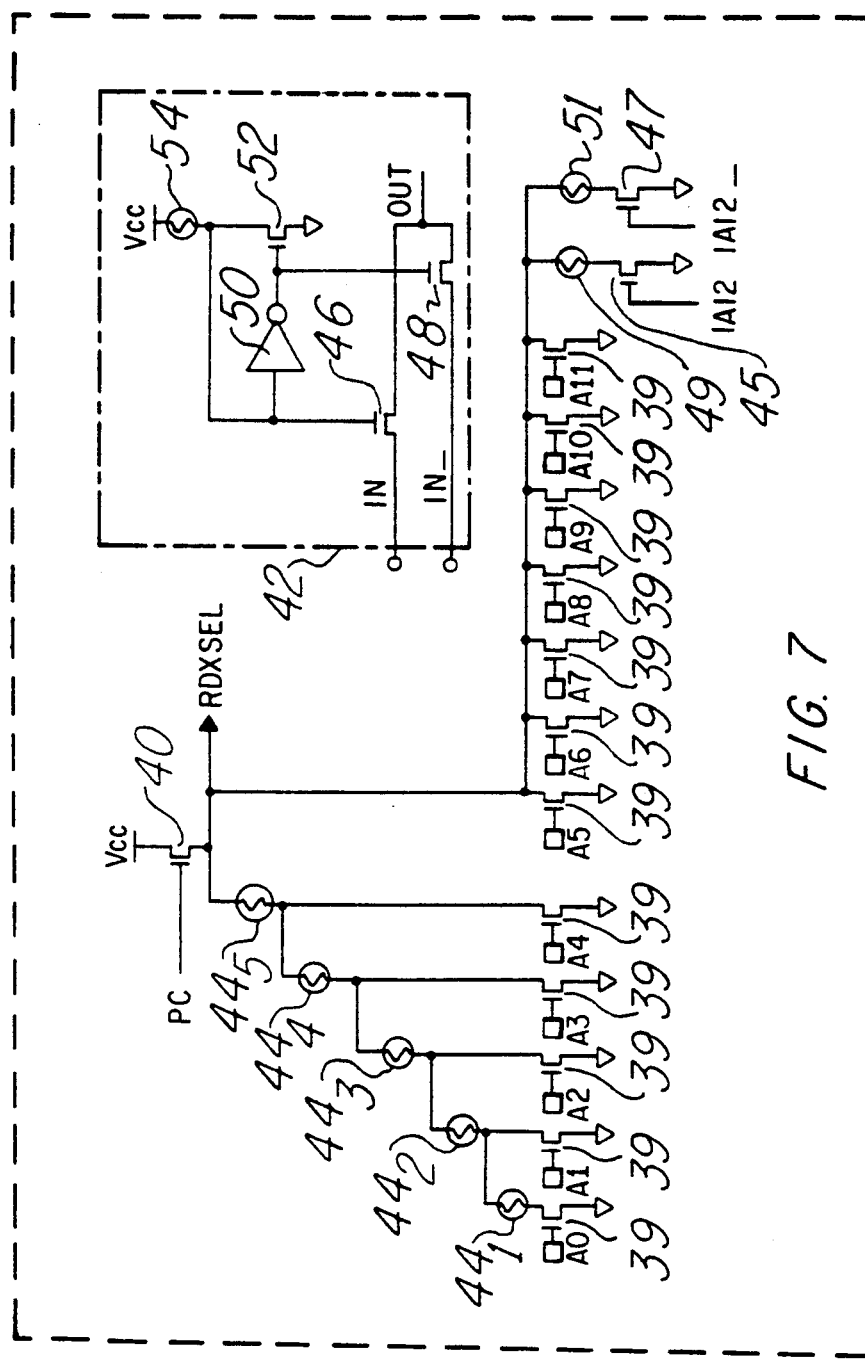
FIG. 7 illustrates a schematic drawing of a row redundancy laser link decoder.

FIG. 7 illustrates a schematic drawing of a row redundancy laser link decoder. A plurality of n-channel field effect transistors, each labeled 39, are coupled to and between redundancy select signal line RDXSEL and circuit ground. Alternatively, p-channel field effect transistors can be used in place of each transistor 39. Still alternatively, bipolar transistors can be used in place of transistors 39 with a base connection substituted for the gate connection together with collector emitter connections substituted for some combinations of drain and source connections. Decoder subcircuits, each labeled A followed by a number, are connected to the gate of an associated transistor 39. P-channel precharge transistor 40 is connected at its source to circuit supply voltage Vcc, while its drain is connected to line RDXSEL. Precharge signal PC is delivered t the gate of transistor 40. Precharge signal PC turns on transistor 40, resulting in precharging line RDXSEL to a logic high level. Fuse 44 is connected to and between the drains of adjacent transistors including transistors 39 and transistor 40. Transistors 45 and 47 are connected to ground and are each coupled to line RDXSEL through fuses 49 and 51 respectively. Note that transistors 45 and 47 along with their respective fuses 49 and 51, can be configured so as to deactivate a particular decoder by bringing its RDXSEL-line low. Inputs to transistors 45 and 47 are labeled IA12 and IA12_. Square 42 in FIG. 7 illustrates a blown-up view of a representative decoder subcircuit A. As shown in square 42, each subcircuit A has an output OUT and inputs, IN and IN_ which are connected to respective n-channel transistors 46 and 48. Each output OUT of subcircuit A is connected to an associated gate of one of the transistors labeled 39. The gate of transistor 46 is connected to the input of inverter 50 while the gate of transistor 48 is connected to the output of inverter 50. The gate of transistor 52 is connected to the output of inverter 50. The drain of pull-down n-channel transistor 52 is coupled to supply voltage Vcc through fuse 54 and it is connected to the input of inverter 50 and the gate of transistor 46. Fuses 54 of subcircuit A are blown corresponding to the binary ones of the address of the row of memory requiring replacement. A signal corresponding to a binary address bit along with a signal corresponding to the complement of the address bit is supplied to inputs IN and IN_, respectively, of an associated subcircuit A. A logic high signal corresponds to a logic 1 bit while a logic low signal corresponds to a logic 0 bit. $2^{12}$ memory locations are indicated by FIG. 7, with a signal corresponding to the least significant bit of an address beign transmitted to subcircuit A0, and with each signal corresponding to a succeeding bit being transmitted to subcircuit A of a unit increment increase in the numerical portion of its label. For instance, a signal corresponding to the 12th bit of an address, along with a signal corresponding to the complement of the 12th bit of an address would be transmitted to inputs IN and IN_, respectively of subcircuit A11. Similarly, a signal corresponding to the 5th bit of an address, along with a signal corresponding to the complement of the 5th bit of an address would be transmitted to inputs IN and IN_ of subcircuit A4. Signals corresponding to all of the addresses of, for instance, a 16 megabit quadrant of memory are transmitted to the inputs of the A subcircuits in the manner set forth above.

If a high signal is sent to input IN and fuse 54 of the associated subcircuit A is not blown, inverter 50 keeps transistor 48 off, thus preventing the logic low signal at input IN_ from getting to output OUT. Additionally, transistor 52 is kept turned off. The logic high signal at input IN is transmitted to output OUT and transistor 39 connected to subcircuit A at its gate, pulls line RDXSEL down in voltage from its precharged level, thus indicating that the row of the current address (whose corresponding signals are now being input into subcircuits A) does not need replacement. A logic low signal at input IN of a subcircuit A whose fuse 54 is not blown results in transistors 48 and 52 being shut off. The logic low signal will be passed to output OUT, thus resulting in not pulling line RDXSEL down in voltage. This is a condition, as will be explained further below, which can lead to the replacement of a row by a redundant row. If however, fuse 54 of a subcircuit A is blown, a logic high signal at input IN of that subcircuit A, is not transmitted to output OUT since transistor 46 will be turned off due to the termination of the connection between voltage Vcc and its gate. Inverter 50 will turn on transistor 48 to allow transmission of the signal at input IN_ (in this case a logic low) to reach output OUT, resulting in not pulling line RDXSEL down. Furthermore, should a fuse 54 be blown, if any of the signals at IN_ is logic high (or rather a signal at input IN is logic low), a transistor 39 connected by its gate to the output of the subcircuit A with the logic high input IN_ signal will pull line RDXSEL low, thus indicating no need for replacement of a row corresponding to the current row address.

If line RDXSEL remains high after input of signals, corresponding to a row address, to the A subcircuits, this is sufficient to indicate that the row of the current row address needs replacement by the redundant row associated with the present row redundancy laser link decoder. Should two or more rows in a block need replacement, a fuse 44 can be blown so as to allow the decoder to select redundant rows of memory for the defective rows, all preceding rows thereof, all subsequent rows up to an additional most significant bit address, and all intervening rows therebetween. Thus, if the third and the tenth row of a block needed replacement with a redundant row, fuse $44_4$ is blown and redundant rows are selected to replace rows 1 through 16. Additionally, the redundant replacement scheme discussed with regard to FIG. 6 can be implemented for use in replacement of memory anywhere within a main memory array. For instance, although it is possible to replace the first 32 rows in a main memory block by blowing fuse $44_5$, it is possible to replace other groups of 32 rows of memory depending upon the address identified as defective in the-laser link decoder. For example, laser link decoder 3 may identify the 1035th address as defective. If in addition to this defective address, there exist other addresses in close proximity which are defective, fuse $44_5$ can be blown so as to allow replacement of the 10024th through 1056th rows of memory, the 32nd group of 32 addresses in which the 1035 address falls.

Although the invention has been described in detail herein with reference to its preferred embodiment, it is to be understood that this description is by way of example only and is not to be construed in a limiting sense. It is to be further understood that numerous changes in the details of the embodiments of the invention, and additional embodiments of the invention, will be apparent to, and may be made by persons of ordinary skill in the art having reference to this description. For instance, although the foregoing invention has been described with regard to a DRAM, it may be used as a redundancy scheme for any memory including read only memories and static random access memories. Further, p-channel transistors, n-channel transistors, and bipolar transistors (n-type or p-type) can be substituted for each other throughout. Additionally, although fuses which are capable of being blown by lasers are discussed, other types of fuses are contemplated, such as electrically blown fuses. It is contemplated that all such changes and additional embodiments are within the true scope and spirit of the invention as claimed below.

I claim:

1. A decoder capable of selecting the multiple replacement of a plurality of rows of memory from an array of memory cells with rows of memory from a redundant block of memory cells comprising:
   a plurality of laser link decoders, operable to receive a plurality of address bits;
   a first plurality of redundant work lines addressable by a first predetermined number of address bits, said first plurality of redundant word lines forming a first redundant word line block;
   a second plurality of redundant word lines addressable by a second predetermined number of address bits, said second plurality of redundant word lines forming a second redundant word line block;
   each laser link decoder from said plurality of laser link decoders being further operable to enable a selectable redundant word line block.

2. A decoder as recited in claim 1 wherein each laser link decoder from said plurality of laser link decoders comprises:
   a plurality of transistors;
   a signal line common to and connected to each of said plurality of transistors;
   a plurality of input circuits, each input circuit being connected to an associated one of said plurality of transistors and including a fuse;
   a plurality of fuses being serially connected together, each fuse from said plurality being further connected to an associated one of said plurality of transistors.

3. A decoder as recited in claim 2 wherein each fuse is capable of being blown with a laser.

4. A decoder as recited in claim 2 which further comprises precharge circuitry for connection to said signal line.

5. A decoder as recited in claim 2 wherein each said input circuit includes an inverter, and first, second and third transistors, said first transistor being connected to the output of said inverter and said input circuit fuse, said second transistor being connected to the input of said inverter and said input circuit fuse, said third transistor being connected to said first and second transistors.

6. A decoder as recited in claim 2 which further includes:
   circuitry for disabling said decoder, said circuitry comprising a pair of transistors, each being operative to receive the complement of an input signal to the other from the pair; and
   a pair of fuses connected to said signal line, each said fuse from said pair being connected to an associated transistor from said pair 7. A decoder as recited in claim 2, wherein each transistor is a n-channel transistor.

8. A decoder as recited in claim 2 wherein each transistor is a p-channel transistor.

9. A decoder as recited in claim 2 wherein each transistor is a bipolar transistor.

10. A decoder as recited in claim 5 wherein said first transistor is connected at its base to the output of said inverter and said third transistor and wherein said first transistor is connected at its drain to said input circuit fuse, the gate of said second transistor and the input of said inverter.

11. A decoder as recited in claim 3 wherein each of said fuses are laser blowable.

* * * * *